US010416736B2

United States Patent
Dupont et al.

(10) Patent No.: US 10,416,736 B2
(45) Date of Patent: Sep. 17, 2019

(54) COMPUTER SYSTEM WITH COOLED ELECTRIC POWER SUPPLY UNIT

(71) Applicant: CALYOS SA, Jumet (BE)

(72) Inventors: Vincent Dupont, Brussels (BE); Nicolas Depret, Saint Amand (BE)

(73) Assignee: CALYOS SA, Jumet (BE)

( * ) Notice: Subject to any disclaimer, the term of this patent is extended or adjusted under 35 U.S.C. 154(b) by 0 days.

(21) Appl. No.: 15/771,048

(22) PCT Filed: Oct. 25, 2016

(86) PCT No.: PCT/EP2016/075612
§ 371 (c)(1),
(2) Date: Apr. 25, 2018

(87) PCT Pub. No.: WO2017/072095
PCT Pub. Date: May 4, 2017

(65) Prior Publication Data
US 2018/0307283 A1    Oct. 25, 2018

(30) Foreign Application Priority Data

Oct. 26, 2015 (FR) ..................................... 15 60205

(51) Int. Cl.
*G06F 1/20* (2006.01)
*H05K 7/14* (2006.01)
*H05K 7/20* (2006.01)

(52) U.S. Cl.
CPC ........... *G06F 1/203* (2013.01); *H05K 7/1487* (2013.01); *H05K 7/203* (2013.01); *H05K 7/20809* (2013.01); *H05K 7/20936* (2013.01); *G06F 2200/201* (2013.01)

(58) Field of Classification Search
CPC ... G06F 1/203; G06F 2200/201; H05K 7/203; H05K 7/1487; H05K 7/20936; H05K 7/20809
USPC ......................................................... 361/699
See application file for complete search history.

(56) References Cited

U.S. PATENT DOCUMENTS

| | | | | |
|---|---|---|---|---|
| 5,323,847 A | * | 6/1994 | Koizumi | H05K 7/20645 165/104.32 |
| 5,458,189 A | * | 10/1995 | Larson | F28D 15/0241 165/104.27 |
| 5,587,880 A | * | 12/1996 | Phillips | F28D 15/0266 165/104.29 |
| 5,731,954 A | * | 3/1998 | Cheon | F25B 21/02 165/104.33 |

(Continued)

*Primary Examiner* — Anatoly Vortman
(74) *Attorney, Agent, or Firm* — Seed IP Law Group LLP

(57) ABSTRACT

An electronic and/or computer device of the computer server type includes: circuit boards and a power supply unit which provides electrical power to various elements of the electronic device. The power supply unit has a fluidtight enclosure, filled with dielectric fluid capable of collecting heat from various components of the power supply unit in order to release it to a heat exchange wall, and is removable. The device includes a two-phase heat transfer circuit with capillary pumped loop having an evaporator thermally coupled to the heat exchange wall of the power supply unit, and a condenser located at a distance from the power supply unit and thermally coupled to a general thermal collector, such that, when in the working position, the heat exchange zone is pressed against the evaporator.

13 Claims, 5 Drawing Sheets

(56) References Cited

U.S. PATENT DOCUMENTS

| | | | | |
|---|---|---|---|---|
| 6,234,240 B1* | 5/2001 | Cheon | ............... | F28D 15/00 |
| | | | | 165/185 |
| 6,250,378 B1* | 6/2001 | Kobayashi | ......... | F28D 15/0266 |
| | | | | 165/104.33 |
| 6,955,212 B1* | 10/2005 | Hsieh | ............... | F28D 1/024 |
| | | | | 165/80.4 |
| 6,999,316 B2* | 2/2006 | Hamman | ............ | F28D 1/0535 |
| | | | | 165/104.31 |
| 7,012,807 B2* | 3/2006 | Chu | ............... | G06F 1/20 |
| | | | | 165/104.33 |
| 7,218,523 B2* | 5/2007 | Hamman | ............ | F28D 1/0535 |
| | | | | 257/930 |
| 7,586,741 B2* | 9/2009 | Matsushima | ......... | G06F 1/206 |
| | | | | 361/679.47 |
| 7,675,748 B2* | 3/2010 | Matsushima | ......... | G11B 33/128 |
| | | | | 361/679.47 |
| 7,770,630 B2 | 8/2010 | Chesser et al. | | |
| 8,611,083 B2* | 12/2013 | Kumlin | ............... | G06F 1/20 |
| | | | | 165/108 |
| 9,812,377 B2* | 11/2017 | Yamada | ............... | H01L 25/072 |
| 2004/0008483 A1* | 1/2004 | Cheon | ............... | G06F 1/20 |
| | | | | 361/679.53 |
| 2010/0073866 A1* | 3/2010 | Toyoda | ............... | F28D 15/043 |
| | | | | 361/679.47 |
| 2011/0132579 A1 | 6/2011 | Best et al. | | |
| 2012/0279686 A1 | 11/2012 | Chainer et al. | | |
| 2013/0208421 A1* | 8/2013 | Chester | ............ | H05K 7/20772 |
| | | | | 361/699 |
| 2014/0216686 A1 | 8/2014 | Shelnutt et al. | | |
| 2015/0296661 A1 | 10/2015 | Mari Curbelo et al. | | |

* cited by examiner

COMPUTER SYSTEM WITH COOLED ELECTRIC POWER SUPPLY UNIT

BACKGROUND

Technical Field

The present invention relates to computer and/or electronic devices; specifically, it concerns different types of computer server modules or assemblies that are conventionally employed in data centers.

Description of the Related Art

The growth in data exchanges over the Internet has led to a huge demand for computing power and storage in servers in order to meet user needs, and in particular these servers are often grouped in centers called data centers.

The cooling requirements for the electronic/computer devices forming server assemblies in these data centers are always growing due to the increasingly high density of processors in these boards.

It has already been proposed to remove heat from the processors, which are the greatest sources of heat dissipation, by using a phase-change heat transfer system, for example as in U.S. Pat. No. 7,770,630.

Also known, for example from patent US2011132579, is a solution called "pool boiling" wherein all components of a circuit board, therefore including the most dissipative components, are immersed in a dielectric liquid which forms the vector for heat removal. However, this solution requires a significant amount of dielectric liquid, therefore a high cost, and also creates multiple possibilities for leakage, which makes it preferable to use local and specific treatment of the most dissipative components. Furthermore, in the solution known as pool boiling, the cold source of the system must necessarily be higher than the level of the liquid.

Computer and/or electronic devices are electrically powered by a power supply unit, responsible for generating stabilized power from the AC voltage of the power grid, which also contains many dissipative components such as rectifier diodes and smoothing coils/choke.

The increase in density and computing power means efficient cooling must be provided for the power supply unit, which is conventionally performed by a fan (or natural convection), with the corresponding increase in bulk.

Moreover, it is usual for the power supply unit to be a replaceable component, as some of these components may fail because the technology is chosen based on cost and market availability. The additional cost that would guarantee a lifespan comparable to the processing portion is not acceptable at the data center scale. It is also possible for the power supply unit to be damaged by a power surge on the grid that supplies it.

BRIEF SUMMARY

It can be seen that the known solutions, particularly the fan-based ones, do not correctly meet this need. There is therefore a need to provide new solutions to ensure efficient cooling of the power supply unit while allowing its replacement and incidentally improving the compactness.

To this end, the invention proposes an electronic and/or computer device comprising:
one or more circuit boards and where appropriate auxiliary elements,
a power supply unit, equipped with a heat exchange zone, which provides electrical power to various elements of the device, the power supply unit having a fluidtight enclosure defining an interior space filled with dielectric fluid, capable of capturing heat on various components of the power supply unit in order to release it to the heat exchange zone, the power supply unit being removable and replaceable,
a two-phase heat transfer circuit with capillary pumped loop having an absorber-heat exchanger thermally coupled to the heat exchange zone of the power supply unit, and a releaser-heat exchanger located at a distance from the power supply unit and thermally coupled to a general thermal collector, characterized in that when in the working position, the heat exchange zone is pressed against the absorber-heat exchanger.

A good thermal contact is thus ensured between the power supply unit and the two-phase heat transfer circuit; the heat generated by the power supply unit can thus be removed at a distance from said unit in a very effective and passive manner. It is understood that the absorber-heat exchanger collects heat on the power supply unit and that the releaser-heat exchanger releases these calories remotely. It is also noted that in one possible configuration, the absorber-heat exchanger is formed by an evaporator and the absorber-heat exchanger is formed by a condenser (with or without subcooling).

Thanks to these dispositions, an advantageous configuration with a replaceable and efficiently cooled power supply unit is obtained. Also, eliminating the fan improves the compactness of the power supply unit; moreover, the proposed solution increases service life and reliability because the risk of clogging is eliminated even in a difficult environment for decentralized systems (atmosphere not clean, dusty).

In some embodiments of the system of the invention, one or more of the following arrangements may possibly be used.

According to one advantageous aspect, the two-phase heat transfer circuit comprises a pair of two flexible hoses connecting the absorber-heat exchanger and the releaser-heat exchanger. Due to the flexibility of said hoses, the absorber-heat exchanger can be easily moved further away from the heat exchange zone of the power supply unit, in order to allow freely moving the power supply unit during a maintenance or replacement operation.

The pair of two hoses may comprise a hose for vapor and a hose for liquid. In particular, this takes advantage of a phenomenon of vaporization in the absorber-heat exchanger, which allows highly efficient collection of the heat on the power supply unit.

The heat exchange zone is typically formed by one or more heat exchange walls forming part of the fluidtight enclosure; it is sufficient to place the absorber-heat exchanger against the heat exchange wall to collect the heat emitted by the power supply unit.

A thermal interface material is advantageously provided which facilitates heat conduction between the heat exchange wall and the absorber-heat exchanger. The contact heat resistance can thus be reduced and the transfer of heat from the power supply unit to the absorber-heat exchanger is also improved.

The absorber-heat exchanger may be an evaporator in which a two-phase working fluid is vaporized by the heat supplied by the heat exchange zone. The phase change allows collecting a large amount of heat in a limited area.

The evaporator may comprise a porous mass providing the capillary pumping function (capillary wick), so that a local means is provided for the pumping function, independent of the means for circulating the two-phase fluid elsewhere.

The absorber-heat exchanger may be located above the releaser-heat exchanger, the driving force being provided by the capillary pumping pressure which overcomes gravity. Due to the performance of the capillary wick, the two-phase fluid in liquid phase can be passively pumped against gravity from the releaser-heat exchanger (condenser). This feature enables easy integration of the system and its cold source into the rack, unlike thermosyphon systems in which the releaser-heat exchanger must be located above the vaporization zone.

The heat exchange zone may comprise, on the side facing towards the interior space, an improved heat exchange surface, preferably in the form of projections or extensions of the solid wall, for example heat exchange fins; this maximizes the surface area available for a good heat exchange between the dielectric fluid and the heat exchange zone.

According to one configuration, the electronic and/or computer device is in the form of a server board module for a data/computing center, the power supply unit having a generally parallelepiped shape, received in a slide guide inside an enclosure of the module, the heat exchange zone being formed by at least one heat exchange wall. The power supply unit may be movable between a working position and an extracted position for replacement or maintenance.

The heat exchange wall extends in an XY plane and a movement in the Z direction at the end of the insertion movement along X near the working position is provided, the slide guide being generally perpendicular to Z; the coupling can thus be automatic between the heat exchange wall and the absorber-heat exchanger at the end of the power supply unit insertion movement.

The general thermal collector may be a shared circuit of cold liquid, this circuit advantageously being shared by several adjacent computer assemblies.

A direct clamping type of attachment by quick-attach screws to secure the absorber-heat exchanger against the heat exchange wall may be provided.

Optionally, a detachable interface (IF2) may be provided between the releaser-heat exchanger and the general thermal collector.

BRIEF DESCRIPTION OF THE SEVERAL VIEWS OF THE DRAWINGS

Other features and advantages of the invention will be apparent from the following description of one of its embodiments, given by way of non-limiting example, with reference to the accompanying drawings.

DETAILED DESCRIPTION

In the different figures, the same references denote identical or similar elements.

Figure 1:
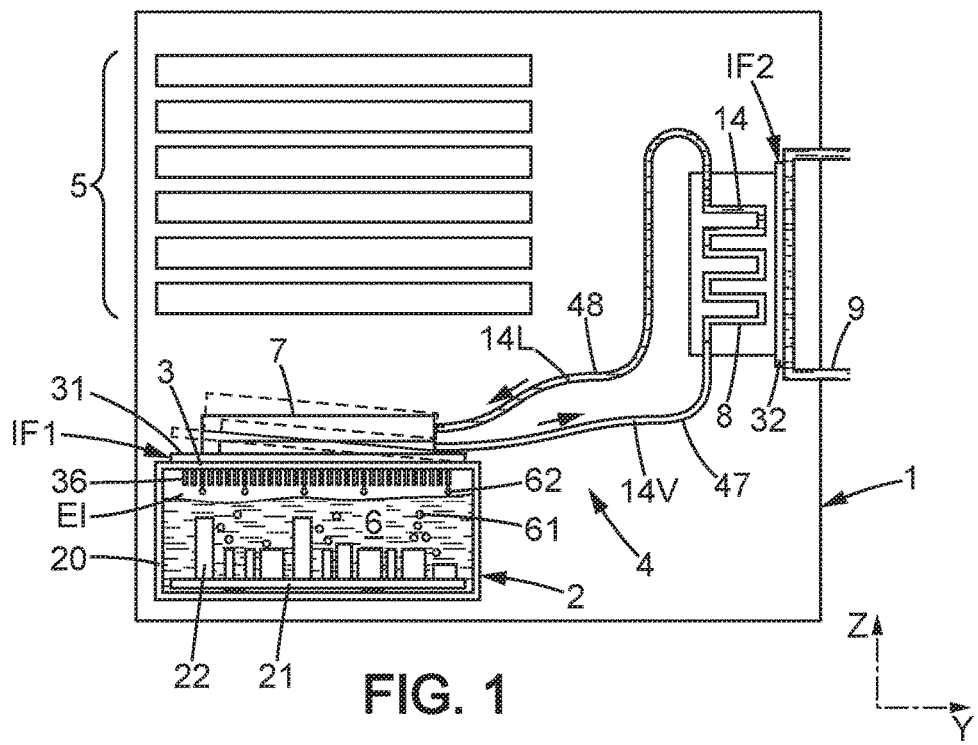
FIG. 1 is a schematic general view of an electronic or computer device with a cooling system comprising a power supply unit cooled in pool boiling mode and cascaded with a two-phase loop.

FIG. 1 schematically represents an example of an electronic or computer device 1 with a removable power supply unit 2. A typical example of such a computer device is a rack of computer server(s) responding to Internet queries.

Figure 5:
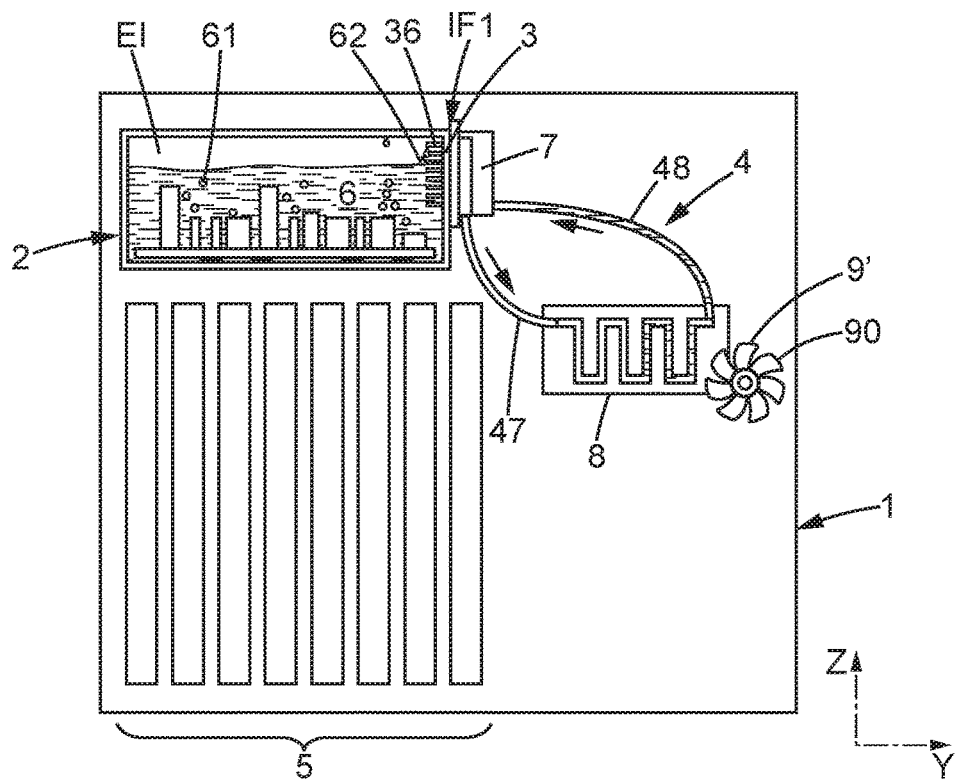
FIG. 5 is similar to FIG. 1 and illustrates three variant features set out below.

This type of electronic or computer device typically comprises one or more circuit boards 5 received in slots. The arrangement of these circuit boards can be horizontal (FIG. 1) or vertical (FIG. 5). In some cases, these circuit boards 5 may be relatively simple, with no protective enclosure; in other cases, these circuit boards may be more elaborate with a protective enclosure and with a combination of motherboard and daughterboard(s), without excluding the presence of hard drives or memory storage units, modules for connection to the Internet, etc.

For the electrical power necessary for the operation of these circuit boards, a dedicated entity called the power supply unit is conventionally provided, which provides various sources of stabilized power. In one configuration, a power supply unit 2 shared by a plurality of circuit boards is provided (FIGS. 1 and 5). In another configuration, in the case of complex circuit boards, the power supply unit may be embedded in the circuit board itself (FIGS. 2, 3, 4 and 7).

As stated in the introduction, due to the growth in computing power, the power supply unit must be cooled in order to be increasingly effective, which is conventionally achieved by means of air convection using a fan. The fan solution has the disadvantage of requiring minimal obstructions in order to have efficient air flow. Moreover, it is known that radiators with fan blades can trap dust, which decreases the effectiveness of the fan solution over time. In addition, the fan makes noise which tends to increase over time, plus the service life of the fan is necessarily limited.

Advantageously according to the present invention, an essentially liquid cooling technique is used to cool the substrate 21 and the various components 22 that are included in the power supply unit. To do this, the power supply unit 2 comprises a fluidtight enclosure 20 defining an interior space EI filled with a dielectric fluid 6. To avoid too high of a pressure increase, an anti-overpressure device is provided in the form of a safety valve and/or an intended weakening in the thickness of the wall ("burst disk"). In this manner, the risk of explosion during a fire can be controlled. Preferably, the anti-overpressure device will be placed on the upper part of the fluidtight enclosure 20 so as to prevent drainage of the liquid.

The dielectric fluid 6 may be selected from the Novec™ line from 3M®, for example for its fire suppression properties.

The dielectric fluid 6 has a vaporization temperature at atmospheric pressure within the range [45° C.-70° C.]. Upon contact with hot components, vapor bubbles 61 are formed (this process is commonly called "pool boiling") and then rise towards the upper wall of the power supply unit due to Archimedes force; there, in contact with the colder wall, they undergo condensation and fall as droplets 62 or trickles into the main volume of dielectric fluid 6.

According to the example illustrated in FIG. 1, the power supply unit 2 has a parallelepiped shape, with an upper face which forms a heat exchange wall 3.

For the purposes of this invention, the heat exchange wall 3 is generally denoted by the term "heat exchange zone", this zone not necessarily being flat or continuous.

The heat exchange wall 3 comprises heat exchange fins 36, on the side facing towards the interior space, which increase the effective heat exchange surface area between the vapor phase of the dielectric fluid and the heat exchange wall.

Instead of the fins shown, it should be noted that any type of improved heat exchange surface can be selected as a solution for increasing the effective exchange surface area between the vapor of the dielectric fluid and the heat exchange wall. Advantageously, the structure of the fins allows efficient drainage of the condensate film.

In addition, a two-phase heat transfer circuit 4 with capillary pumped loop is provided, configured to remove heat at the power supply unit and to release it at a distance away, doing so by means of a two-phase fluid 14.

More specifically, the two-phase heat transfer circuit 4 comprises an absorber-heat exchanger 7 thermally coupled to the heat exchange zone 3 of the power supply unit, and a releaser-heat exchanger 8 located at a distance from the power supply unit and thermally coupled to a general thermal collector 9.

Furthermore, the absorber-heat exchanger 7 and the releaser-heat exchanger 8 are interconnected by hoses (or pipes), a first hose (denoted 47) carrying the working fluid from the absorber-heat exchanger 7 to the releaser-heat exchanger 8, and the other hose (denoted 48) carrying the working fluid from the releaser-heat exchanger 8 to the absorber-heat exchanger 7.

According to the example of FIG. 1, the absorber-heat exchanger 7 is formed by an evaporator and the absorber-heat exchanger 8 is formed by a condenser (with or without sub-cooling), in which case the first hose essentially carries vapor 14V and the second hose essentially carries liquid 14L.

Advantageously, these two hoses 47,48 are flexible, which allows mechanically moving the absorber-heat exchanger 7, in particular in order to remove the power supply unit as was discussed in the introduction to this document.

In the normal working configuration (operational use), the heat exchange zone 3 is pressed against the absorber-heat exchanger 7, at the location of a first identified interface IFI. In the "flat" configuration shown in FIG. 1, the lower face of the absorber-heat exchanger 7 interfaces with the upper face of the heat exchange zone 3 with the optional interposition 3 of a thermal interface material 31 facilitating heat conduction between the heat exchange wall 3 and the absorber-heat exchanger 7. The thermal interface material 31 is a grease or a graphite compound.

The releaser-heat exchanger 8 serves to carry heat away from the two-phase working fluid 14 towards another heat transfer fluid, here a water-based cold liquid 9.

Figure 2:
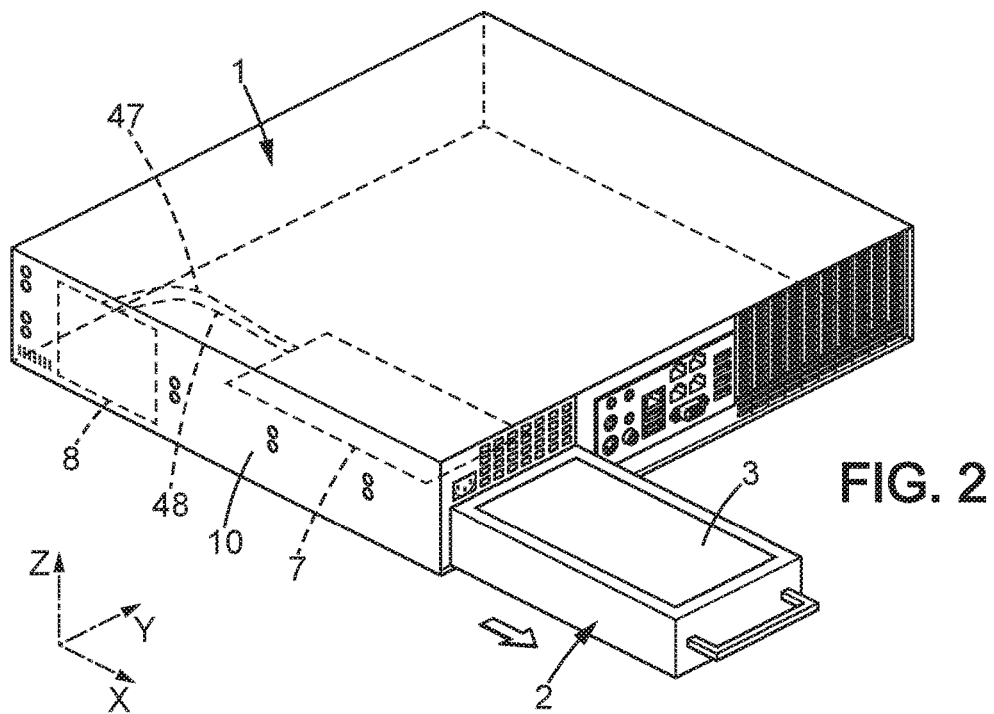
FIG. 2 is a general perspective view of the rear area of a server board module according to another configuration, with a removable power supply unit.

According to another configuration shown in FIG. 2, the electronic device 1 is a server board module delimited by a protective enclosure 10. The power supply unit 2 is normally housed inside the enclosure 10, but it is shown here in an extracted position, useful for maintenance and/or replacement.

Specifically, the power supply unit is movable between a working position and an extraction position as will be seen below.

The heat exchange wall 3 extends in an XY plane. The Z direction corresponds to the primary normal vector of the server board module.

In the working position of the power supply unit, the absorber-heat exchanger 7 is located above said heat exchange wall.

In the illustrated example, the releaser-heat exchanger 8 is pressed against one of the faces of the enclosure 10 of the module (FIG. 2). In this configuration, it is the entire enclosure 10 which is used as the heat radiating element, and which forms the general thermal collector within the meaning of the invention.

Figure 3:
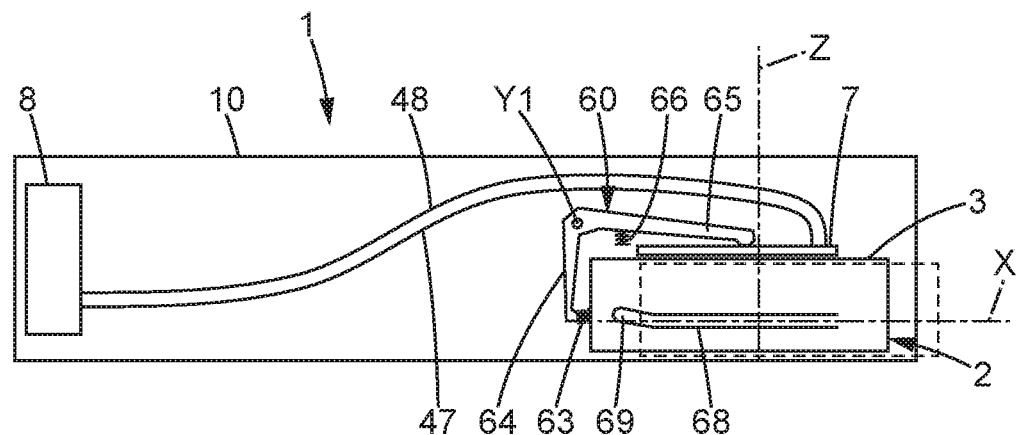
FIG. 3 shows a server board module in cross-section.

FIG. 3 illustrates two possible solutions, among other solutions, for thermally coupling the absorber-heat exchanger 7 with the heat exchange wall of the power supply unit.

According to a first solution, the movement of inserting the power supply unit is rectilinear and parallel to the X axis, and the absorber-heat exchanger is mounted with a degree of freedom of translation along the Z axis. Furthermore, there is provided a rocker 60 mounted so as to rotate about an axis YI. When the bottom of the power supply unit approaches the end-of-travel position, it presses against a spring 63 which in turn pushes on a first lever arm 64 of the rocker which rotates clockwise; a second lever arm 65 of the rocker pushes the absorber-heat exchanger 7 against the heat exchange wall 3. When the power supply unit is removed, a return spring 66 pushes the absorber-heat exchanger 7 away from the coupling position.

According to a second solution, the slide guide 68 which guides the power supply unit is not rectilinear but bends upward at the end of travel, with a ramp area 69. In this case, the absorber-heat exchanger can be mounted in a more-or-less stationary position. Near the end of travel, the power supply unit approaches the absorber-heat exchanger along Z until contact, with actual placement at the end of travel.

An electrical connection coupling (not shown in the figures) then allows the power supply unit 2 to supply stabilized power to other entities of the server module 1.

Figure 4:
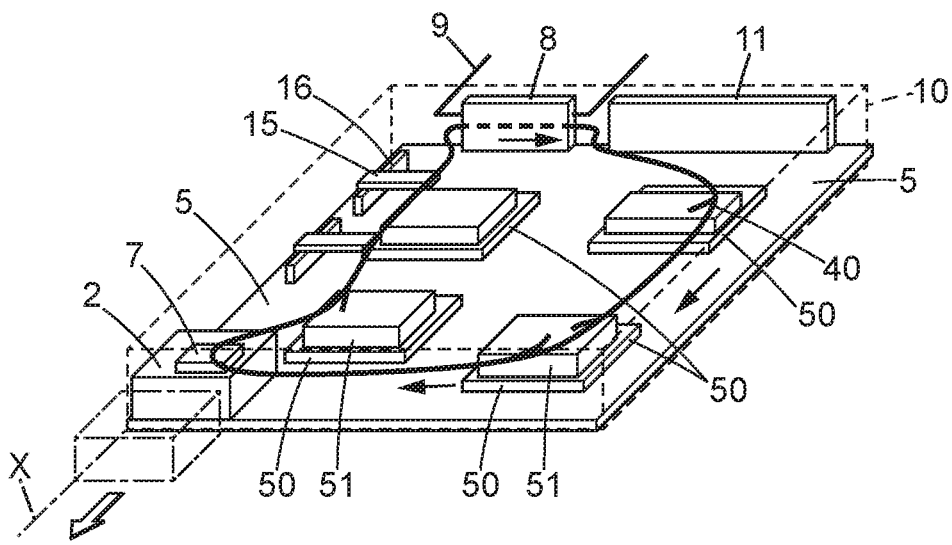
FIG. 4 is another general perspective view of a server board module.

FIG. 4 illustrates another configuration of the server board module in which the two-phase heat transfer circuit 4 collects heat over a plurality of dissipative components present on the circuit board, in particular the main processors (CPU or GPU) 50. To each processor is thermally coupled an evaporator 51 connected to a main heat collection circuit 40. The main heat collection circuit 40 is in the form of a closed loop, for example annular, with working fluid which circulates passively (no moving mechanical parts or consumption of external energy), either in two-phase form (liquid+vapor) or in essentially liquid form. According to one possible configuration, the working fluid may be set in motion in the main collection circuit by a phenomenon of vapor release at the outlet of each of the evaporators placed on the main processors; under these conditions, the presence of a capillary wick in the absorber-heat exchanger 7 is not strictly necessary.

This main heat collection circuit 40 also supplies the absorber-heat exchanger 7 with working fluid.

One will note that some secondary devices such as memory modules 16 are connected to the main collection circuit 40 by a thermal bridge 15.

An electrical connection coupling 11 is used to connect the circuit board to the chassis ('backplane' connection).

There are several possibilities for the absorber-heat exchanger 7. According to a first possibility, it is an evaporator without capillary medium, the circulation being ensured by capillary wicks present in the CPU evaporators 51 as mentioned above.

Figure 6:
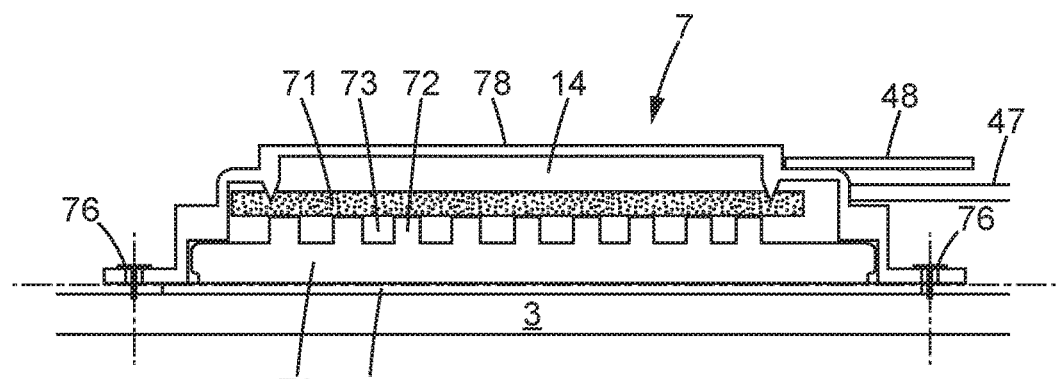
FIG. 6 shows a detailed section view of the capillary evaporator.

According to a second possibility, it may also be an evaporator with capillary medium as shown in FIG. 6, in which case there is a local pumping means.

According to a third possibility, it may be a cold sink heat exchanger using the working fluid in a substantially liquid state, the fluid being used primarily to cool the CPUs by vaporization and also to cool auxiliary devices such as the power supply unit, memory cards, etc.

FIG. 5 illustrates a configuration with circuit boards 5 arranged vertically, and the general thermal collector 9' being formed by a heat exchanger 90 with fan-pulsed air.

Another variant visible in FIG. 5 illustrates the different relative positions for the power supply unit 2 and for the releaser-heat exchanger 8. In this case, the absorber-heat exchanger 7 is a capillary evaporator, the capillary wicking providing the passive pumping pressure to overcome gravity.

One will also note that the heat exchange wall of the power supply unit is located on a side and not on top.

This illustrates the extremely high flexibility in installing the various components in a computer device.

In FIG. 6, the capillary wick 71 is in contact with the hot plate 70. The latter has teeth 72 which define grooves 73 for carrying away the vapor.

Quick-attach screws 76 are provided for securing the structure of the evaporator 78 to the heat exchange wall 3 of the power supply unit of the evaporator.

Figure 7:
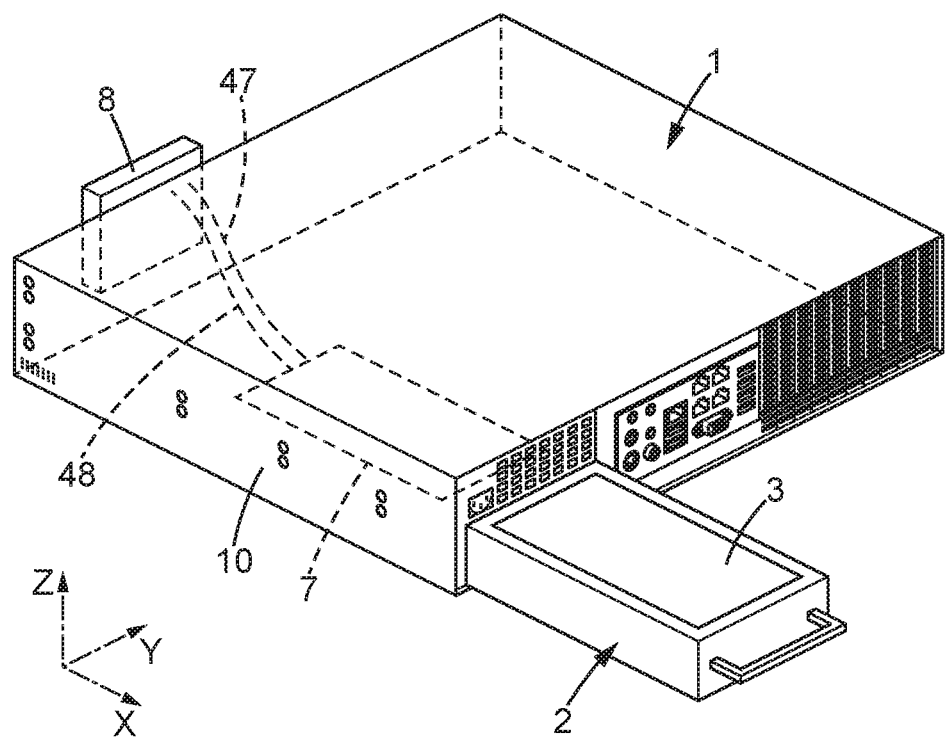
FIG. 7 is similar to FIG. 2 but shows a variant with a different position for the releaser-heat exchanger.

FIG. 7 illustrates a configuration similar to the one already represented in FIG. 2, wherein the two-phase heat transfer circuit connects the absorber-heat exchanger 7, in contact with the power supply unit, except that the releaser-heat exchanger 8 is on the opposite face, for example next to the electrical connection coupling 11.

One will note here that the length of the hoses 47,48 is not imposed, as their path is not necessarily straight and may make detours. Advantageously, there is therefore great freedom in positioning both the power supply unit and the cold source intended for cooling it.

In the examples presented above, one will note that the dielectric fluid 6, typically Novec™ from 3M®, fills the inner cavity of the power supply unit 2, while the rest of the server board is not immersed in dielectric fluid. Given the high cost of dielectric fluid, this allows reducing the amount required for a server. For example, for a server board module of the 2U standard, the volume of dielectric fluid used in the power supply unit will be less than 3 liters, and for a server board module of the 1U standard, the volume of dielectric fluid used in the power supply unit will be less than 1 liter. This is therefore advantageous compared to solutions where almost the entire server board is submerged.

Figure 8:
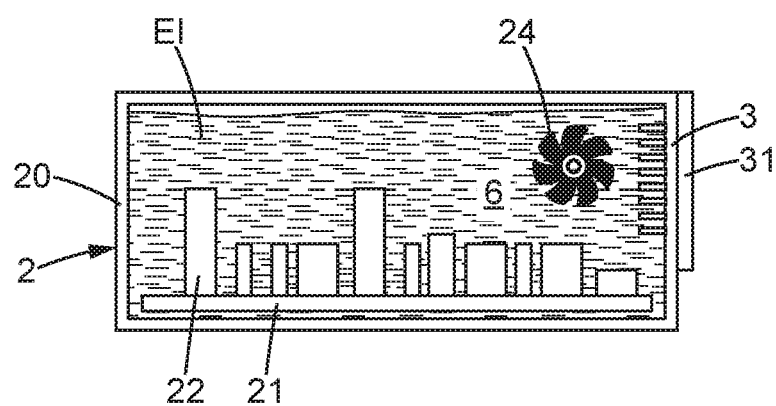
FIG. 8 shows a section view of the power supply unit according to a variant with a propeller.

FIG. 8 illustrates a variant concerning the use of dielectric fluid 6 with no phase change, for example such as dielectric oil. Natural convection is generally not sufficiently effective because of the high viscosity of the oil. In this case, forced convection is provided by a device which sets the fluid in motion, such as a propeller 24. In this case, the system loses its completely passive character for the internal portion of the power supply unit.

Figure 9:
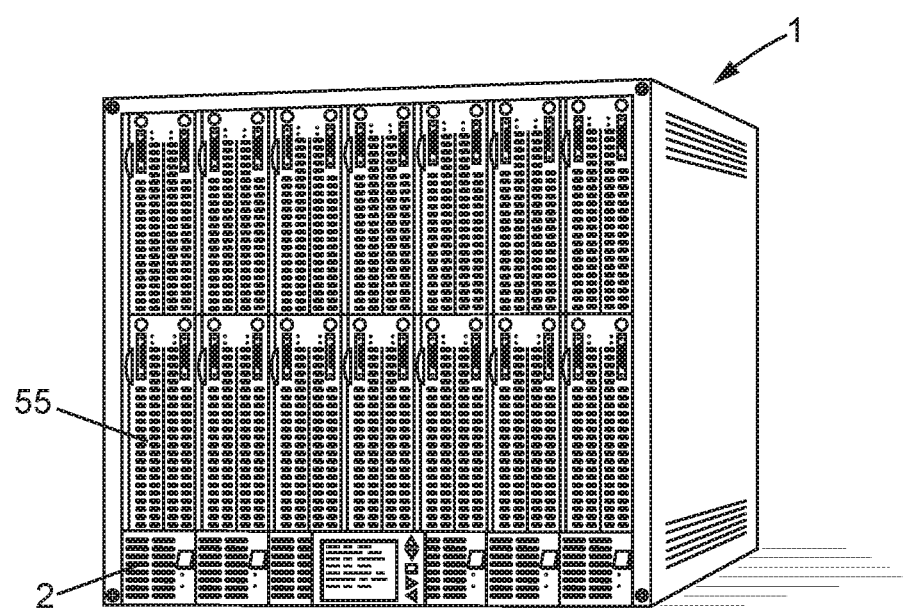
FIG. 9 shows a view of a computer server rack.

FIG. 9 illustrates a vertically arranged configuration for server module racks 55, with two rows one above the other. In the lower portion are service units such as the power supply unit(s) 2 and coupling(s) for connecting to the Internet.

Note that in FIG. 1, an interface denoted IF2 is provided by means of which one can decouple the releaser-heat exchanger 8 and the general thermal collector 9.

In a variant not shown in the figures, this second interface IF2 is utilized and a macro power supply module is provided which incorporates not only the power supply unit 2 as described above, but also its own ("private") two-phase heat transfer circuit with its hoses (optionally flexible) and releaser-heat exchanger. In this case, the absorber-heat exchanger 7 may be non-detachably mounted on the heat exchange wall 3 of the power supply unit.

In addition to data center server boards, one can of course apply the solution proposed above to rugged PCs intended to be subjected to particularly harsh environments.

The invention claimed is:

1. A device comprising:
   one or more circuit boards,
   a power supply unit, equipped with a heat exchange zone, which provides electrical power to various elements of the device, including the one or more circuit boards, the power supply unit having a fluidtight enclosure defining an interior space therein, the interior space being filled with dielectric fluid capable of collecting heat from various components of the power supply unit in order to release the heat to the heat exchange zone, the power supply unit being removable and replaceable, and
   a two-phase heat transfer circuit with a capillary pumped loop having an absorber-heat exchanger thermally coupled to the heat exchange zone of the power supply unit, and a releaser-heat exchanger located at a distance from the power supply unit and thermally coupled to a general thermal collector, wherein portions of the device other than the power supply unit are not immersed in the dielectric fluid, and wherein when in a working position, the heat exchange zone is pressed against the absorber-heat exchanger.

2. The device according to claim 1, wherein the two-phase heat transfer circuit comprises a pair of flexible hoses connecting the absorber-heat exchanger and the releaser-heat exchanger.

3. The device according to claim 2, wherein the pair of hoses comprises a hose for vapor and a hose for liquid.

4. The device according to claim 1, wherein the heat exchange zone is formed by one or more heat exchange walls forming part of the fluidtight enclosure.

5. The device according to claim 4, comprising a thermal interface material facilitating heat conduction between the one or more heat exchange walls and the absorber-heat exchanger.

6. The device according to claim 1, wherein the absorber-heat exchanger is an evaporator in which a two-phase working fluid is vaporized by heat supplied by the heat exchange zone.

7. The device according to claim 6, wherein the evaporator comprises a porous mass providing a capillary pumping function.

8. The device according to claim 7, wherein the evaporator is located above the releaser-heat exchanger, the capillary pumping function provided by the porous mass supplying a driving force which overcomes gravity.

9. The device according to claim 1, wherein the heat exchange zone comprises, on a side facing towards the interior space, fin-type heat exchange projections.

10. The device according to claim 1, wherein the device is a server board module for a data/computing center, the power supply unit having a generally parallelepiped shape, received in a slide guide inside an enclosure of the module, the heat exchange zone being formed by at least one heat exchange wall.

11. The device according to claim 10, wherein the heat exchange wall extends in an XY plane and is configured to move in a Z direction, at an end of travel along X, near the working position, the slide guide being generally perpendicular to Z.

12. The device according to claim 1, comprising a detachable interface between the releaser-heat exchanger and the general thermal collector.

13. The device according to claim 1, wherein the dielectric fluid in the power supply unit has a volume of less than 3 liters.

* * * * *